US012813069B2

(12) United States Patent

Kim et al.

(10) Patent No.: US 12,813,069 B2
(45) Date of Patent: Nov. 24, 2026

(54) LIGHT EMITTING DISPLAY DEVICE

(71) Applicant: LG DISPLAY CO., LTD., Seoul (KR)

(72) Inventors: Ho-Jin Kim, Paju-si (KR); Pureum Kim, Paju-si (KR); Changhwa Jun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 208 days.

(21) Appl. No.: 18/911,912

(22) Filed: Oct. 10, 2024

(65) Prior Publication Data

US 2025/0204147 A1 Jun. 19, 2025

(30) Foreign Application Priority Data

Dec. 14, 2023 (KR) ........................ 10-2023-0181716

(51) Int. Cl.

*H10K 50/852* (2023.01)
*H10K 50/19* (2023.01)
*H10K 50/816* (2023.01)
*H10K 50/826* (2023.01)

(52) U.S. Cl.

CPC ........... *H10K 50/852* (2023.02); *H10K 50/19* (2023.02); *H10K 50/816* (2023.02); *H10K 50/826* (2023.02)

(58) Field of Classification Search

CPC .... H10K 50/852; H10K 50/19; H10K 50/816; H10K 50/826

See application file for complete search history.

(56) References Cited

U.S. PATENT DOCUMENTS

2014/0353597 A1* 12/2014 Ahn .................... H10K 59/122 438/34
2016/0240591 A1* 8/2016 Song ..................... H10K 59/35

FOREIGN PATENT DOCUMENTS

KR 10-2018-0068560 A 6/2018
KR 10-1925010 B1 12/2018
KR 10-2021-0116511 A 9/2021

* cited by examiner

*Primary Examiner* — Joseph L Williams
(74) *Attorney, Agent, or Firm* — Fish & Richardson P.C.

(57) ABSTRACT

A light emitting display device includes a first pixel providing a first light, a second pixel providing a second light and a third pixel providing a third light, the first pixel, the second pixel and the third pixel arrayed on a substrate; anode electrodes disposed at each of the first pixel, the second pixel and the third pixel, each anode electrode including a transparent layer; a reflective layer disposed under the transparent layer; a first emission layer disposed over the first pixel and the second pixel, on the anode electrodes; a second emission layer disposed in the third pixel, on the anode electrode; a cathode electrode on the first emission layer and the second emission layer; and a resonance layer disposed at any one of an upper side and a lower side of the first emission layer.

20 Claims, 6 Drawing Sheets

LIGHT EMITTING DISPLAY DEVICE

CROSS-REFERENCE TO RELATED APPLICATION

This application claims the priority of Korean Patent Application No. 10-2023-0181716 filed on Dec. 14, 2023, which is hereby incorporated by reference in its entirety.

BACKGROUND

Field of the Disclosure

The present disclosure relates to a light emitting display device having a micro-cavity structure.

Description of the Background

In particular, the light emitting display device which is a self-luminous display, has an excellent optical performance such as a viewing angle and color realization degree, so that its application field is gradually widening and is receiving attention as an image display device. Due to these advantages, it is attracting attention as the most suitable display for implementing 4K ultra-high-resolution display and up to 8K ultra-high-resolution display. As the resolution is increased, the size of the pixel becomes smaller and the size of the emission area occupied in the pixel also becomes smaller. When the size of a pixel in the electroluminescence display becomes small, a top emission type structure may be applied to maximize the size ratio of the emission area in the pixel.

Specifically, in a structure that implements ultra-high resolution over 3,000 PPI pixel density, since the size of the pixel is very small, it is very important to increase the luminous efficiency. For example, it is possible to increase the luminous efficiency by applying the micro-cavity structure. When a micro-cavity is applied, the structure of the light emitting display device may become complicated and manufacturing costs may increase. Therefore, there is a need to develop a micro-cavity structure that has a simple structure, low manufacturing cost, and improved luminous efficiency with low power consumption.

SUMMARY

Accordingly, the present disclosure, as for solving the problems described above, is to provide a light emitting display device with a micro-cavity structure that improves luminous efficiency.

The present disclosure is also to provide a light emitting display device having higher luminous efficiency with low power consumption by applying a simplified micro-cavity structure to ultra-high resolution.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a light emitting display device includes a first pixel providing a first light, a second pixel providing a second light and a third pixel providing a third light, the first pixel, the second pixel and the third pixel arrayed on a substrate; anode electrodes disposed at each of the first pixel, the second pixel and the third pixel, the anode electrode including a transparent layer; a reflective layer disposed under the anode electrode; a first emission layer disposed over the first pixel and the second pixel, on the anode electrodes; a second emission layer disposed at the third pixel, on the anode electrode; a cathode electrode on the first emission layer and the second emission layer; and a resonance layer disposed at any one of an upper side and a lower side of the first emission layer.

In one aspect, a first distance between the reflective layer and the cathode electrode in the first pixel is set to a first resonance distance corresponding to one of integer multiples of half-wavelength of the first light. A second distance between the reflective layer and the cathode electrode in the second pixel is set to a second resonance distance corresponding to one of integer multiples of half-wavelength of the second light. A third distance between the reflective layer and the cathode electrode in the third pixel is set to a third resonance distance corresponding to one of integer multiples of half-wavelength of the third light.

In one aspect, the third pixel includes: a thickness of the first emission layer corresponds to the first resonance distance. A sum thickness of the first emission layer and the resonance layer corresponds to the second resonance distance. A thickness of the second emission layer corresponds to the third resonance distance.

In one aspect, the first light is a green light. The second light is a red light. The third light is a blue light.

In one aspect, the first light is a red light. The second light is a green light. The third light is a blue light.

In one aspect, the anode electrodes include: a first anode electrode disposed at the first pixel; a second anode electrode disposed at the second pixel; and a third anode electrode disposed at the third pixel. The second anode electrode includes the transparent layer and the resonance layer. The cathode electrode includes a semi-transparent layer transmitting some parts of a light provided from the first emission layer and the second emission layer, and reflecting rest parts of the light.

In one aspect, the first anode electrode and the third anode electrode include the reflective layer and the transparent layer. The second anode electrode includes the reflective layer, the transparent layer and the resonance layer.

In one aspect, the second anode electrode and the third anode electrode include the reflective layer and the transparent layer. The first anode electrode includes the reflective layer, the transparent layer and the resonance layer.

In one aspect, the cathode electrode includes: a transparent cathode layer; and a semi-transparent cathode layer on the transparent layer. The resonance layer is disposed at any one of between the transparent cathode layer and the semi-transparent cathode layer and under the transparent cathode layer, in the second pixel.

In one aspect, a first distance between the reflective layer and the semi-transparent cathode electrode in the first pixel is set to a first resonance distance corresponding to one of integer multiples of half-wavelength of the first light. A second distance between the reflective layer and the semi-transparent cathode electrode in the second pixel is set to a second resonance distance corresponding to one of integer multiples of half-wavelength of the second light. A third distance between the reflective layer and the semi-transparent cathode electrode in the third pixel is set to a third resonance distance corresponding to one of integer multiples of half-wavelength of the third light.

In one aspect, the first emission layer includes: a first light emitting layer providing the first light; a charge generation layer disposed on the first light emitting layer; and a second light emitting layer disposed on the charge generation layer and providing the second light. The second emission layer includes a third light emitting layer providing the third light.

In one aspect, the first light emitting layer includes a first light emitting material providing a green light. The second light emitting layer includes a second light emitting material providing a red light. The third light emitting layer includes a third light emitting material providing a blue light.

In one aspect, the first light emitting layer includes a first light emitting material providing a red light. The second light emitting layer includes a second light emitting material providing a green light. The third light emitting layer includes a third light emitting material providing a blue light.

In one aspect, the second emission layer includes: third light emitting layer including a third light emitting material providing a blue light; a charge generation layer disposed on the third light emitting layer; and a fourth light emitting layer disposed on the charge generation layer and including the third light emitting material providing the blue light.

In one aspect, the light emitting display device further comprises: a hole functional layer disposed between the anode electrode and the first emission layer and the second emission layer; and an electron functional layer disposed between the cathode electrode and the first emission layer and the second emission layer.

In one aspect, the resonance layer is disposed at any one of between the hole functional layer and the first emission layer and between the first emission layer and the electron functional layer.

In one aspect, the transparent layer is disposed between the resonance layer and the reflective layer.

In order to accomplish the above-mentioned features of the present disclosure, a light emitting display device according to the present disclosure comprises: a first pixel providing a first light, a second pixel providing a second light and a third pixel providing a third light, the first pixel, the second pixel and the third pixel arrayed on a substrate; anode electrodes disposed at each of the first pixel, the second pixel and the third pixel, the anode electrode including a transparent layer; a reflective layer disposed under the anode electrode; a first emission layer disposed over the first pixel and the second pixel, on the anode electrodes; a second emission layer disposed at the third pixel, on the anode electrode; a cathode electrode on the first emission layer and the second emission layer; and a resonance layer disposed on the transparent layer in the first pixel or the second pixel.

The light emitting display device according to the present disclosure may be a top emission type light emitting display device with maximized luminous efficiency for each color pixel. The present disclosure may provide a light emitting display device with improved luminous efficiency and ultra-high-density resolution. The light emitting display device according to the present disclosure may have the advantage of high color purity and low manufacturing cost by implementing a micro-cavity with a simple structure. In addition, the present disclosure may provide a light emitting display device having low power consumption by providing high luminous efficiency with low power consumption.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
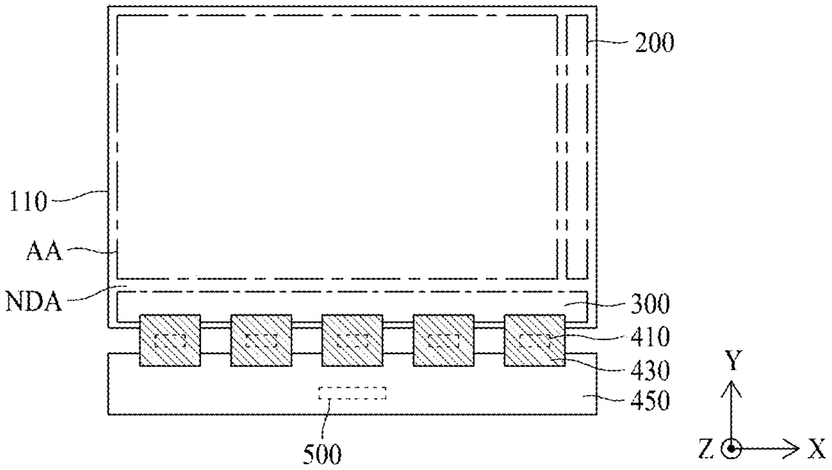
FIG. 1 is a plan view illustrating a schematic structure of a light emitting display device according to the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the case that "comprise," "have," "include," "contain," "constitute," "make up of," "formed of", and the like described in the present specification are used, one or more part may also be present unless "only" is used. The terms in a singular form may include plural forms unless noted to the contrary.

In construing an element, the element is construed as including an error range although there is no explicit description.

In describing a positional relationship, for example, when the positional order is described as "on," "over," "above," "below," "next," "beside," or the like, the case of no contact there-between may be included, unless "just" or "direct" is used, that is, one or more other parts may be disposed located between the two parts. For example, where an element or layer is disposed "on" another element or layer, a third layer or element may be interposed therebetween. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

The terms, such as "below," "lower," "above," "upper" and the like, may be used herein to describe a relationship between element(s) as illustrated in the drawings. It will be understood that the terms are spatially relative and based on the orientation depicted in the drawings.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

In describing a temporal relationship, for example, when the temporal order is described as "after," "subsequent," "next," and "before," a case which is not continuous may be included, unless "just," "immediate(ly)" or "direct(ly)" is used.

It will be understood that, although the terms "first," "second," "A," "B," "(a)," and "(b)" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly connected to or indirectly connected to that other element, unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each individual element of the first, second and third elements.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in a co-dependent relationship.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, and it is not limited to the scale shown in the drawings.

Hereinafter, referring to attached figures, we will explain about the present disclosure, in detail. FIG. 1 is a diagram illustrating a schematic structure of a light emitting display device according to the present disclosure. In FIG. 1, X-axis may be parallel to the extending direction of the scan line, Y-axis may be parallel to the extending direction of the data line, and Z-axis may represent the thickness direction of the display.

Referring to FIG. 1, a light emitting display device according to the present disclosure comprises a substrate 110, a gate (or scan) driver 200, a pad portion 300, a source driving IC (Integrated Circuit) 410, a flexible film 430, a circuit board 450, and a timing controller 500, without being limited thereto. More or less elements may be included.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The non-display area NDA may refer to an area outside of the display area AA. The non-display area NDA may be also referred to as an edge area or a bezel area. The display area AA, which is an area for representing the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include the scan line and the data line, respectively. Each pixel may include a green pixel, a red pixel and a blue pixel, without being limited thereto. A set of green pixel, red pixel and blue pixel grouped together may be called a single unit pixel.

The non-display area NDA, which is an area not representing the video images, may be defined at the circumference areas of the substrate 110 surrounding all or some of the display area AA. In the non-display area NDA, the gate driver 200 and the pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (Gate driver In Panel) type, without being limited thereto. GIP type means that the gate driver 200 is directly formed on the substrate 110. Alternatively, the gate driver 200 may be disposed in the display area AA on the substrate 110.

The pad portion 300 may supply the data signals to the data line according to the data control signal received from the timing controller 500. The pad portion 300 may be made as a driver chip and mounted on the flexible line film 430. Further, the flexible line film 430 may be attached at the non-display area NDA at any one outside of the display area AA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible line film 430 as a COF (Chip On Film) or COP (Chip On Plastic) type or COG (Chip On Glass) type, without being limited thereto.

The flexible line film 430 may include a plurality of first link lines connecting the pad portion 300 to the source driving IC 410, and a plurality of second link lines connecting the pad portion 300 to the circuit board 450. The flexible line film 430 may be attached on the pad portion 300 using an anisotropic conducting film, so that the pad portion 300 may be connected to the first link lines of the flexible line film 430.

The circuit board 450 may be attached to the flexible line film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2:
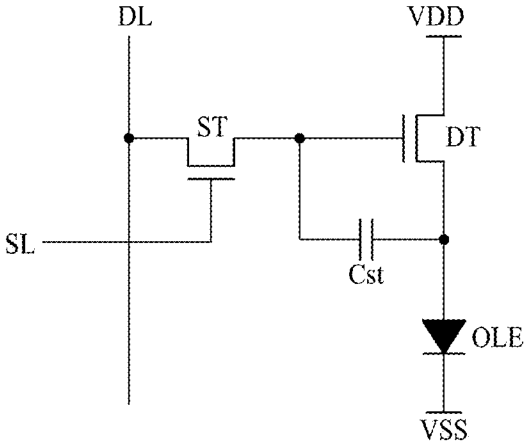
FIG. 2 is a circuit diagram illustrating a structure of one pixel in a light emitting display device according to the present disclosure.
Figure 3:
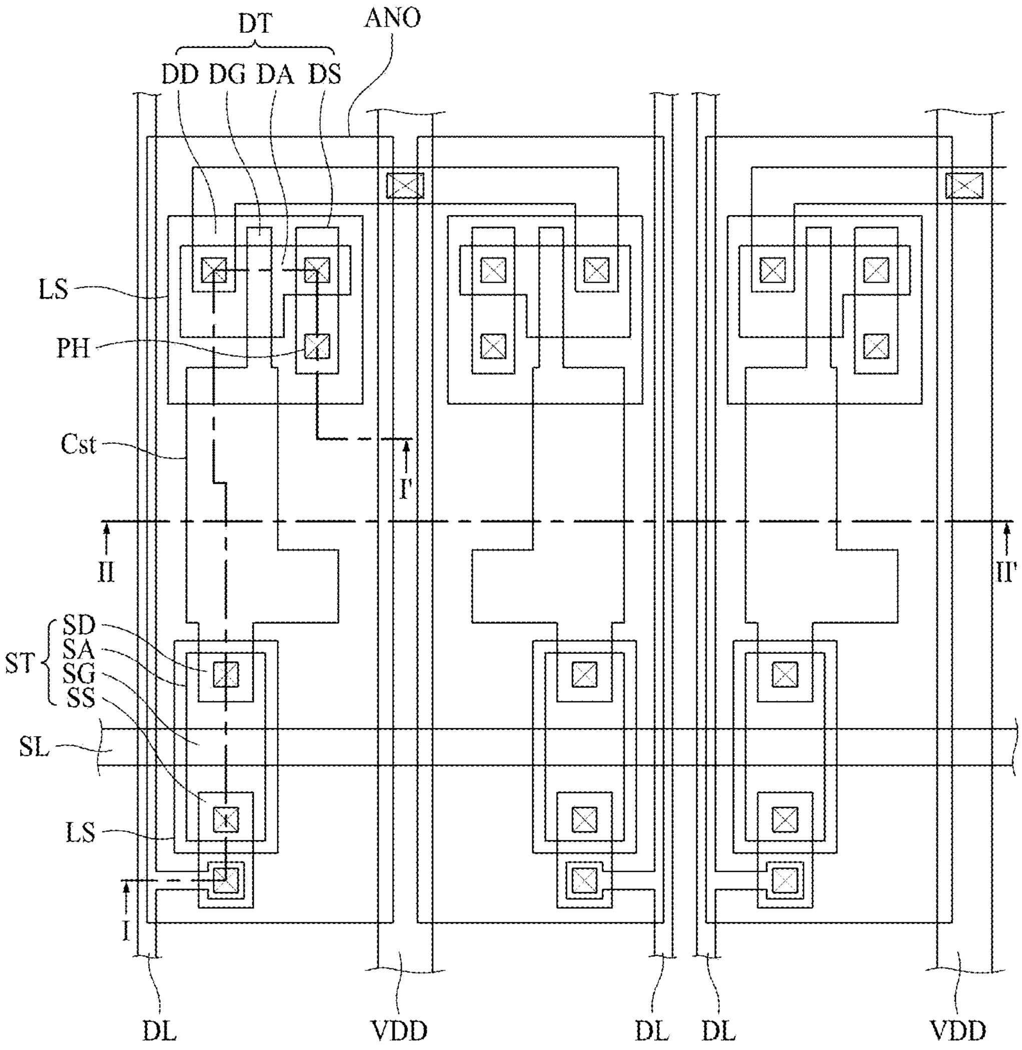
FIG. 3 is an enlarged plan view illustrating a structure of the three pixels sequentially arrayed in the light emitting display device according to the present disclosure.
Figure 4:
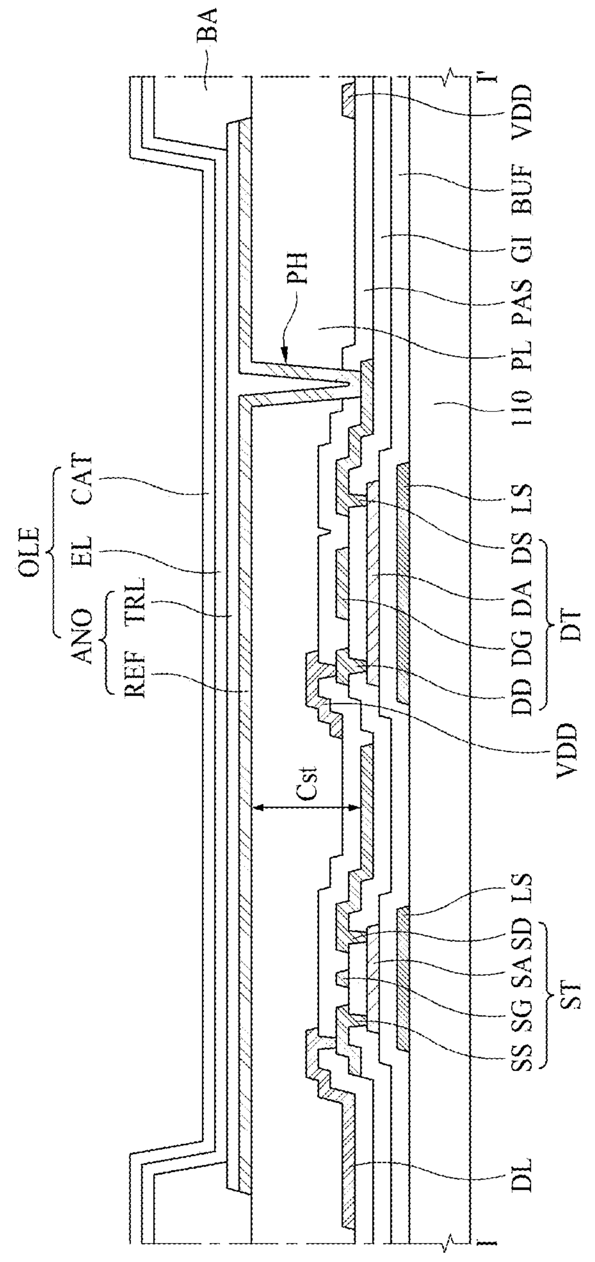
FIG. 4 is a cross-sectional view along to cutting line I-I' in FIG. 3, for illustrating the structure of the light emitting display device according to the present disclosure.

FIG. 1 is a plane view illustrating a schematic structure of an electroluminescence display according to the present disclosure. FIG. 2 is a circuit diagram illustrating a structure of one pixel according to the present disclosure. FIG. 3 is an enlarged plan view illustrating a structure of the pixels successively arrayed in the light emitting display device according to the present disclosure. FIG. 4 is a cross-sectional view along to cutting line I-I' in FIG. 3, for illustrating the structure of the light emitting display device according to the present disclosure.

Referring to FIGS. 2 to 4, one-pixel P of the light emitting display may include a scan line SL, a data line DL and a driving current line VDD, without being limited thereto. Also, one-pixel P of the light emitting display may further include a driving current line VSS. One-pixel P of the light emitting display may include a switching thin film transistor ST, a driving thin film transistor DT, a light emitting diode OLE and a storage capacitance (or, capacitor) Cst. The driving current line VDD may be supplied with a high-level voltage for driving the light emitting diode OLE.

For example, the switching thin film transistor ST may be disposed at the portion where the scan line SL and the data line DL is crossing. The switching thin film transistor ST may include a gate electrode SG, a source electrode SS and a drain electrode SD. The gate electrode SG of the switching thin film transistor ST may be branched from the scan line SL, or it may be defined as a portion of the scan line SL, as shown in FIG. 3. In the switching thin film transistor ST, the source electrode SS may be connected to the data line DL and the drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light diode OLE of the selected pixel by the switching thin film transistor ST. The driving thin film transistor DT may include a gate electrode DG, a source electrode DS and a drain electrode DD. The gate electrode DG of the driving thin film transistor DT may be connected to the drain electrode SD of the switching thin film transistor ST. In the driving thin film transistor DT, the drain electrode DD may be connected to the driving current line VDD, and the source electrode DS may be connected to the light emitting diode OLE, such as an anode electrode ANO of the light emitting diode OLE. A storage capacitance Cst may be disposed between the drain electrode SD of the switching thin film transistor ST and the anode electrode ANO of the light emitting diode OLE. That is, the storage capacitance Cst may be disposed between the drain electrode SD of the switching thin film transistor ST and the source electrode DS of the driving thin film transistor DT.

The driving thin film transistor DT may be disposed between the driving current line VDD and the light emitting diode OLE. The driving thin film transistor DT may be used for driving the light emitting didode OLE. Specifically, the driving thin film transistor DT may control the amount of electric currents flowing to the light emitting diode OLE from the driving current line VDD according to the voltage level of the gate electrode DG of the driving thin film transistor DT connected to the switching drain electrode SD of the switching thin film transistor ST.

FIG. 4 shows the thin film transistors ST and DT having the top gate structure, without being limited thereto. The top gate structure means that the gate electrodes SG and DG is disposed on the semiconductor layers SA and DA. In detail, the top gate structure may have the semiconductor layers SA and DA first formed on the substrate 110, and the gate electrodes SG and DG formed on the gate insulating layer GI covering the semiconductor layers SA and DA. For another example, the light emitting display according to the present disclosure may have a bottom gate structure. For yet another example, the light emitting display according to the present disclosure may have a dual gate structure. The bottom gate structure may have the gate electrodes firstly formed on the substrate, and the semiconductor layers on the gate insulating layer covering the gate electrodes. The light emitting display device according to the present disclosure, in implementing ultra-high resolution density, may include a thin film transistor having a top gate structure to increase the aperture ratio, which is the ratio of the emission area to the pixel area.

In addition, according to the top gate structure shown in FIG. 4, the source electrode SS and the drain electrode SD of the source thin film transistor ST, and the source electrode DS and the drain electrode DD of the drain thin film transistor DT are formed on the same layer with the gate electrodes SG and DG. In other word, the source electrodes SS and DS and the drain electrodes SD and DD may be formed on the same layer with the layer on which the scan line SL and the gate electrodes SG and DG are formed, but the data line DL and the driving current line VDD may be formed on the different layer from the scan line SL. The intermediate insulating layer ILD may be stacked on the gate electrodes SG and DG, the source electrodes SS and DS and the drain electrodes SD and DD. The data line DL and the driving current line VDD may be disposed on the intermediate insulating layer ILD.

The light emitting diode OLE may include an anode electrode ANO, an emission layer EL and a cathode electrode CAT. The emission layer EL may include an organic material layer. For example, the emission layer EL may include one or more of a hole injection layer (HIL), a hole transmitting layer (HTL), an electron transmitting layer (ETL) and an electron injection layer (EIL), but the present disclosure is not limited thereto. The light emitting diode OLE may emit the light according to the amount of the electric current controlled by the driving thin film transistor DT. In other word, the light emitting diode OLE may be driven by the voltage differences between the low-level voltage and the high-level voltage controlled by driving thin film transistor DT, thereby the luminance of the light emitting display device may be controlled. The anode electrode ANO of the light emitting diode OLE may be connected to the source electrode DS of the driving thin film transistor DT, and the cathode electrode CAT may be connected to the low-level power line VSS supplying the low-level electric voltage. The light emitting diode OLE may be driven by the voltage difference between the high-level electric voltage controlled by the driving thin film transistor DT and the low-level electric voltage.

The passivation layer PAS may be deposited on the substrate 110 having the thin film transistors ST and DT. The passivation layer PAS may be made of the organic material such as silicon oxide (SiOx) and silicon nitride (SiNx). The planarization layer PL may be deposited on the passivation layer PAS. The planarization layer PL may be a film layer for flattening the non-uniform surface of the substrate 110 on which the thin film transistors ST and DT are formed. To make the height difference uniform, the planarization layer PL may be formed of an organic material. The passivation layer PAS and the planarization layer PL may have a pixel contact hole PH exposing a part of the source electrode DS of the driving thin film transistor DT. Depending on circumstances, the passivation layer PAS may be omitted when the planarization layer PL has a function of protecting the thin film transistors ST and DT.

The anode electrode ANO may be formed on the planarization layer PL covering the thin film transistors ST and DT. Specifically, the anode electrode ANO may be configured to cover a portion of the planarization layer PL. The anode electrode ANO may be connected to the source electrode DS of the driving thin film transistor DT through the pixel contact hole PH passing through the passivation layer PAS and the planarization layer PL. The anode electrode ANO may have different structure according to the emission structure of the light emitting diode OLE. For an example of the bottom emission type in which lights generated from the emission layer emit to the direction at which the substrate 110 is disposed, the anode electrode ANO may include a transparent conductive material. For another example of the top emission type in which lights generated from the emission layer emit to the opposite direction to the substrate 110, the anode electrode ANO may be made of metal material having excellent light reflectance. For example, the anode electrode may include any one of silver (Ag), aluminum (Al), molybdenum (Mo), gold (Au), magnesium (Mg), calcium (Ca) and barium (Ba), or alloy of them, without being limited thereto. Otherwise, the anode electrode ANO of the top emission type may include a metal layer having excellent light reflectance and a transparent conductive material layer on the metal layer, without being limited thereto.

In the present disclosure, the top emission type may be suitable for realization of ultra-high resolution. Therefore, the anode electrode ANO may be a layer that reflects most of all the light provided from the emission layer EL toward the cathode electrode CAT. For example, the anode electrode ANO may have a structure in which a transparent layer TRL and a reflective layer REF may be stacked. The transparent layer TRL may be made of a transparent conductive material such as indium-tin-oxide (ITO) or indium-zinc-oxide (IZO). The reflective layer REF may be made of a metal material having an excellent light reflectance. For example, the reflective layer REF may be made of one of silver (Ag), aluminum (Al), molybdenum (Mo), gold (Au), magnesium (Mg), calcium (Ca), and barium (Ba), or an alloy of two or more of them, without being limited thereto.

In the top emission type, the anode electrode ANO may have a maximum area in a pixel area defined by the data line DL, the driving current line VDD and the scan line SL. In this case, the thin film transistors ST and DT may be disposed to overlap with the anode electrode ANO under the anode electrode ANO. In addition, the data line DL, the driving current line VDD and the scan line SL may also partially overlap the anode electrode ANO.

A bank BA is formed on the anode electrode ANO. The bank BA may cover the circumference areas of the anode electrode ANO, and expose most of middle portions of the anode electrode ANO. The exposed area of the anode electrode ANO by the bank BA may be defined as an emission area of the pixel. The bank BA may include an insulating material. As an example, the bank BA may include an organic insulating material such as acryl resin, epoxy resin, phenolic resin, polyamide resin, and/or polyimide resin, etc. Alternatively, the bank BA may include an inorganic insulating material such as silicon nitride, aluminum nitride, zirconium nitride, titanium nitride, hafnium nitride, tantalum nitride, silicon oxide, aluminum oxide, or titanium oxide, etc. Also, the bank BA may include a black dye in order to absorb light incident from the outside.

An emission layer EL is deposited on the anode electrode ANO and the bank BA. The emission layer EL may be deposited as being in surface-contact with the anode electrode ANO and the bank BA. The emission layer EL may be deposited on the whole of the display area AA as covering the anode electrode ANO and the bank BA. For an aspect, the emission layer EL may include two or more emission layers which are vertically stacked for combining different colors of light to emit white light. For example, the emission layer EL may include a first emission layer and a second emission layer for combining a first color light and a second color light to emit white light, without being limited thereto.

For another aspect, the emission layer EL may include any one of blue emission layer, green emission layer and red emission layer for providing color light allocated at the pixel, without being limited thereto. Also, the emission layer EL may include any one of cyan emission layer, magenta emission layer and yellow emission layer, or the like. In this case, the emission layer EL may be disposed as being isolated within each emission area defined by the bank BA. In addition, the light emitting diode OLE may further include functional layers for enhancing the emission efficiency and/or the light time of the emission layer EL.

A cathode electrode CAT is deposited on the emission layer EL. The cathode electrode CAT may be deposited as being in surface-contact with the emission layer EL. The cathode electrode CAT may be deposited as covering whole surface of the substrate 110 as being connected to overall of pixels. For establishing the micro-cavity structure, the cathode electrode CAT may be a thin layer made of a semi-transparent material, without being limited thereto. The semi-transparent thin layer may transmit some of the incident light and reflect the rest. For an example, the cathode electrode CAT may be an ultra-thin metal layer made of a meal material such as aluminum (Al), silver (Ag), gold (Au) or magnesium (Mg), with a thickness of 10 nm to 30 nm, without being limited thereto. When the metal material is formed with a thickness of 10 nm to 30 nm, 70% to 30% of the incident light may be transmitted. In the light emitting display device according to the present disclosure, the cathode electrode CA may have a thickness that for transmitting 30% of light and reflecting 70% of light, to increase the micro-cavity effect.

The distance between the reflective layer REF and the cathode electrode CAT, in detail the distance between the upper surface of the reflective layer REF and the lower surface of the cathode electrode CAT, may be an integer multiple of the half wavelength of the light generated from the emission layer EL. The resonance distance may be referred to a distance corresponding to an integer multiple of the half wavelength of the specific color light generated from the emission layer EL of a specific pixel. By adjusting the thickness of the emission layer EL and/or the thickness of the transparent layer TRL of the anode electrode ANO, the distance between the reflective layer REF and the cathode electrode CAT may be set to correspond to the resonance distance.

The micro-cavity structure is a structure for maximizing the emitting efficiency of light with a specific color emitted from the emission layer EL. For example, the emission layer EL may include any one of blue emission layer, green emission layer and red emission layer, without being limited thereto. Therefore, hereinafter, various aspects of implementing a micro-cavity in a structure in which three pixels emitting blue color light, green color light and red color light, respectively, are arranged in succession will be described.

Figure 5:
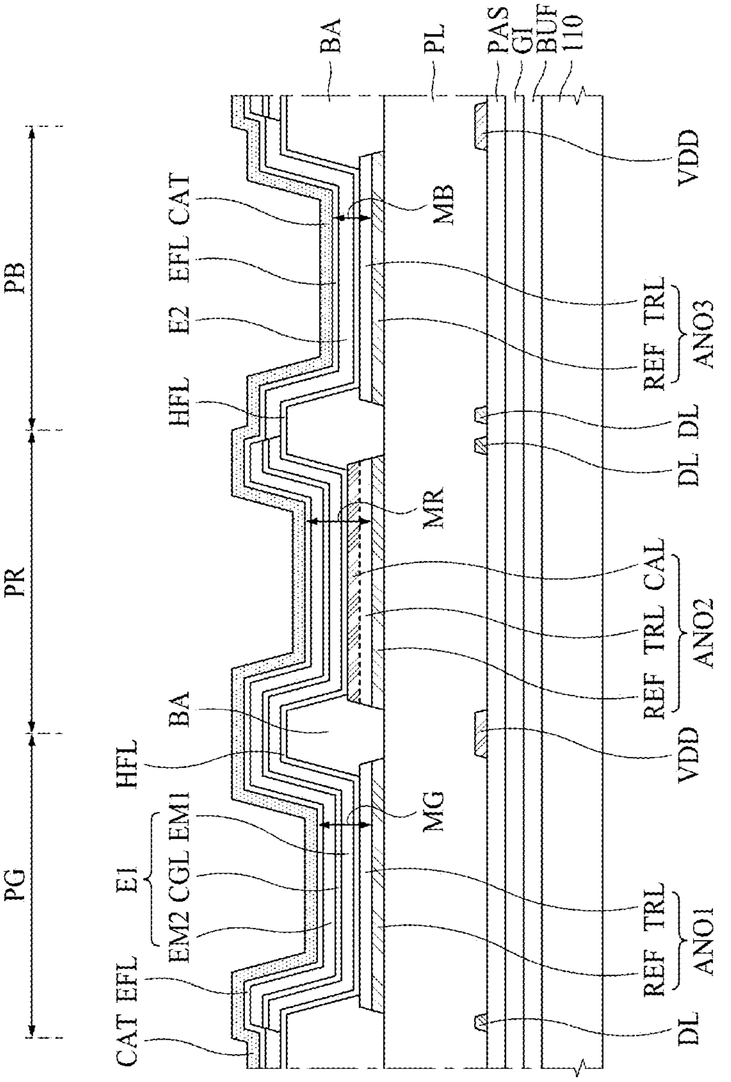
FIG. 5 is a cross-sectional view along to cutting line II-II' in FIG. 3, for illustrating a structure of successive pixels in a light emitting display device according to a first aspect of the present disclosure.

Hereinafter, referring to FIG. 5, a first aspect of the present disclosure will be described. FIG. 5 is a cross-sectional view along to cutting line II-II' in FIG. 3, for illustrating a structure of successive pixels in a light emitting display device according to a first aspect of the present disclosure.

The light emitting display device according to the first exemplary embodiment may include a first pixel emitting a first light, a second pixel emitting a second light, and a third pixel emitting a third light which are arrayed in succession. For example, the light emitting display device according to the first aspect may include a green pixel PG emitting green light, a red pixel PR emitting red light, and a blue pixel PB emitting blue light which are arrayed in succession without being limited thereto. The pixels of other colors are also possible, which are not shown in FIG. 5. Here, the green light may be referred to as a first light, the red light may be referred to as a second light, and the blue light may be referred to as a third light. Further, the green pixel PG may be referred to as a first pixel, the red pixel PR may be referred to as a second pixel, and the blue pixel PB may be referred to as a third pixel. Alternatively, the light emitting display device according to the first exemplary embodiment may include a red pixel PR emitting red light, a green pixel PG emitting green light, and a blue pixel PB emitting blue light which are arrayed in succession, without being limited thereto. Here, the red light may be referred to as a first light, the green light may be referred to as a second light, and the blue light may be referred to as a third light. Further, the red pixel PR may be referred to as a first pixel, the green pixel PG may be referred to as a second pixel, and the blue pixel PB may be referred to as a third pixel The light emitting display device according to the first aspect may comprise a buffer layer BUF, a gate insulating layer GI, a passivation layer PAS and a planarization layer PL, which are sequentially deposited on a substrate 110. In FIG. 5, the elements of the thin film transistor disposed under the planarization layer PL may be not shown for convenience.

A plurality of anode electrodes ANO1, ANO2 and ANO3 are formed on the planarization layer PL. The anode electrodes are assigned one by one to green pixel PG, red pixel PR and blue pixel PB arranged in succession. For example, a first anode electrode ANO1 may be disposed in the green pixel PG, a second anode electrode ANO2 may be disposed in the red pixel PR, and a third anode electrode ANO3 may be disposed in the blue pixel PB.

The light emitting display device according to the first aspect may have the micro-cavity structure. In the first aspect, the micro-cavity structure may have features in which distance between each of anode electrodes ANO1, ANO2 and ANO3 disposed in green pixel PG, red pixel PR and blue pixel PB and the cathode electrode CAT is set to correspond to integer multiple of the half wavelength of the color light emitted from each of the green pixel PG, the red pixel PR and the blue pixel PB.

The first anode electrode ANO1 disposed in the green pixel PG may have a structure in which a reflective layer REF and a transparent layer TRL are sequentially stacked on the planarization layer PL. The second anode electrode ANO2 disposed in the red pixel PR may have a multi-layered structure in which a reflective layer REF, a transparent layer TRL and a resonance layer CAL are sequentially stacked on the planarization layer PL. The third anode electrode ANO3 in the blue pixel PB may have a multi-layered structure in which a reflective layer REF and a transparent layer TRL are sequentially stacked on the planarization layer PL. Here, the reflective layer REF and transparent layer TRL disposed in each pixel may have the same thickness, respectively.

The reflective layer REF may be made of any one material selected from silver (Ag), aluminum (Al), molybdenum (Mo), gold (Au), magnesium (Mg), calcium (Ca) or barium (Ba), or two or more alloy thereof, without being limited thereto. The reflective layer REF may be configured to have a thickness of 500 Å to 2,000 Å (50 nm to 200 nm) so that all light provided by the emission layer EL stacked thereon may be reflected upward, that is, in the direction of the cathode electrode CAT. The transparent layer TRL may be made of a transparent conductive material such as indium-tin-oxide (ITO) or indium-zinc-oxide (IZO), without being limited thereto. The transparent layer TRL may have a thickness in range of 500 Å to 1,000 Å (50 nm to 100 nm), but it is not limited thereto.

The resonance layer CAL included in the second anode electrode ANO2 may be made of a transparent conductive material the same as the transparent layer TRL. The resonance layer CAL may have a thickness for ensuring the resonance distance of the red light provided from the red pixel PR where the second anode electrode ANO2 is disposed. For details, it will be explained in the later description for micro-cavity structure.

An emission layer may be deposited on the anode electrodes ANO1, ANO2 and ANO3. In the first aspect, a first emission layer E1 may be commonly disposed in the green pixel PG and the red pixel PR. Further, in the blue pixel PB, a second emission layer E2 may be disposed separately from the first emission layer E1. Specifically, the first emission layer E1 may be commonly disposed on the anode electrodes ANO1, ANO2 in the green pixel PG and the red pixel PR, and the second emission layer E2 may be disposed on the anode electrode ANO3 in the blue pixel PB, without being limited thereto.

The first emission layer E1 may include a red light emitting layer, a charge generation layer and a green light emitting layer which are sequentially stacked on the first anode electrode ANO1 and the second anode electrode ANO2. For example, a red light emitting layer, a charge generation layer and a green light emitting layer are sequentially stacked on the first anode electrode ANO1 and the second anode electrode ANO2. For another example, a green light emitting layer, a charge generation layer and a red light emitting layer are sequentially stacked on the first anode electrode ANO1 and the second anode electrode ANO2 to form the first emission layer E1. That is, the first emission layer E1 may include a first emitting layer EM1, a charge generation layer CGL and a second emitting layer EM2 sequentially stacked. While, the second emission layer E2 may include only a blue light emitting layer. For example, the second emission layer E2 may include a single layer of blue light emitting layer. For another example, the second emission layer E2 may include double stacked layer of third emitting layers emitting blue light. For the case of double stacked layer, the second emission layer E2 may include a first blue light emitting layer, a charge generation layer and a second blue light emitting layer which are sequentially stacked on the third anode electrode ANO3.

A cathode electrode CAT may be continuously deposited across the green pixel PG, red pixel PR and blue pixel PB on the first emission layer E1 and the second emission layer E2. In the light emitting display device according to the first aspect, the cathode electrode CAT may be made of a semi-transparent conductive material. For example, the cathode electrode CA may be an ultrathin metal layer which may be made of a metal material including aluminum (Al), silver (Ag), gold (Au) and magnesium (Mg) with a thickness in range of 10 nm to 30 nm, without being limited thereto.

In addition, a hole functional layer HFL may be disposed under the first emission layer E1 and the second emission layer E2. An electron functional layer EFL may be deposited on the first emission layer E1 and the second emission layer E2. The hole functional layer HFL and the electron functional layer EFL may be commonly deposited as being across the green pixel PG, the red pixel PR and the blue pixel PB. For example, the hole functional layer HFL may be deposited on the first anode electrode ANO1, the second anode electrode ANO2, the third anode electrode ANO3 and the bank BA. In addition, the electron functional layer EFL may be deposited on the first emission layer E1 and the second emission layer E2 over the entire surface of the substrate 110. In addition, the hole functional layer HFL may be disposed under the first emission layer E1 and the second emission layer E2 over the entire surface of the substrate 110.

The light emitting display device according to the first aspect may have a micro-cavity structure in which a micro-cavity phenomenon may occur between the reflective layer REF and the cathode electrode CAT. That is, the distance between the reflective layer REF and the cathode electrode CAT may be set as being corresponding to an integer multiple of half wavelength of the color light provide from each pixel. Hereinafter, specific examples for setting the distance between the reflection layer REF and the cathode electrode CAT in each pixel to be the resonance distance will be explained.

In the green pixel PG, the distance between the reflective layer REF and the cathode electrode CAT may be a green resonance distance MG. For example, the green resonance distance MG may be a thickness corresponding to one of integer multiples of 275 nm, which is ½ of 550 nm, the representative wavelength of green light. For example, the green resonance distance MG may be any one of 275 nm, 550 nm, 825 nm, 1,100 nm and 1,375 nm, without being limited thereto.

In the red pixel PR, the distance between the reflective layer REF and the cathode electrode CAT may be a red resonance distance MR. For example, the red resonance distance MR may be a thickness corresponding to one of integer multiples of 315 nm, which is ½ of 630 nm, the representative wavelength of red light. For example, the red resonance distance MR may be any one of 315 nm, 630 nm, 945 nm, 1,260 nm and 1,575 nm, without being limited thereto.

In the green pixel PG and the red pixel PR, the first emission layer E1 may be commonly deposited on both the green pixel PG and the red pixel PR. Therefore, the thickness of the first emission layer E1 may be set to have a thickness corresponding to the green resonance distance MG of the green pixel PG. For example, the thickness of sum of the transparent layer TRL, the hole functional layer HFL, the first emission layer E1 and the electron functional layer EFL between the reflective layer REF and the cathode electrode CAT may be set to have a thickness of 550 nm, without being limited thereto. The hole functional layer HFL and the electron functional layer EFL may be deposited across the green pixel PG, the red pixel PR and the blue pixel PB, so they may have a uniformed thickness over the entire substrate 110. Therefore, the thickness of the first emission layer E1 may be adjusted to set the green resonance distance MG. Here, the first emission layer E1 is not the layer having the green resonance distance MG, but the layer for adjusting the green resonance distance MG. Therefore, the first emission layer E1 may be described as having a 'corresponding thickness' to the green resonance distance MG. As the first emission layer E1 has the green light emitting layer and the red light emitting layer, the green light and the red light may be simultaneously generated. However, because the green pixel PG has the green resonance distance MG, only green light may be emitted through the cathode electrode CAT.

The first emission layer E1 disposed in the red pixel PR may be extended to the green pixel PG. The red pixel PR may include the first emission layer E1 having the same structure with the green pixel PG. Therefore, the sum thickness of the transparent layer TRL, the hole functional layer HFL, the first emission layer E1 and the electron functional layer EFL may be 550 nm, in the red pixel PR. Under this thickness condition, the red pixel PR may also emit the green light due to the micro-cavity effect. However, in the red pixel PR, the resonance layer CAL is further disposed on the transparent layer TRL, without being limited thereto. By adjusting the thickness of the resonance layer CAL, the distance between the reflection layer REF and the cathode electrode CAT in the red pixel PR may be set to be the red resonance distance MR. For example, as the sum thickness of the transparent layer TRL, the hole functional layer HFL, the first emission layer E1 and the electron functional layer EFL is 550 nm, by adjusting the thickness of the resonance layer CAL to have 80 nm, the distance between the reflective layer REF and the cathode electrode CAT may be set to 630 nm. Alternatively, by thickening the transparent layer TRL in the red pixel PR, the resonance distance needed for the red pixel PR may be adjusted or acquired.

Here, the first emission layer E1 and the resonance layer CAL may not be the layer corresponding to the red resonance distance MR, but may be the layer for adjusting the red resonance distance MR. Therefore, the first emission layer E1 and the resonance layer CAL may be described as having a ‘corresponding thickness’ to the red resonance distance MR. In particular, by adjusting the thickness of the resonance layer CAL, the distance between the reflective layer REF and the cathode electrode CAT may be set to correspond to the red resonance distance MR. As the first emission layer E1 may include a green light emitting layer and a red light emitting layer, the first emission layer E1 may emit green light and red light simultaneously. However, as the red pixel PR have the red resonance distance MR, only red light may be provided through the cathode electrode CAT, at the red pixel PR.

The distance between the reflective layer REF and the cathode electrode CAT in the blue pixel PB may be corresponding to a blue resonance distance MB. The blue resonance distance MB may have a thickness corresponding to an integer multiple of 230 nm, which is ½ of 460 nm, the representative wavelength of blue light. For example, the blue resonance distance MB may be selected one of 230 nm, 460 nm, 690 nm, 920 nm and 1,150 nm. For example, the sum thickness of the transparent layer TRL, the hole functional layer HFL, the second emission layer E2 and the electron functional layer EFL between the reflective layer REF and the cathode electrode CAT may be formed to have a thickness of 460 nm. As the second emission layer E2 disposed in the blue pixel PB may be deposited separately from the first emission layer E1 disposed in the green pixel PG and the red pixel PR, it may have different thickness from the first emission layer E1. As the hole functional layer HFL and the electron functional layer EFL may be deposited as extended from the green pixel PG to the red pixel PR, it may have a uniformed thickness over entire substrate 110. Therefore, the thickness of the second emission layer E2 may be adjusted for adjusting to the blue resonance distance MB. As the second emission layer E2 may not be the layer having the blue resonance distance MB but be the layer for adjusting to the blue resonance distance MB, the second emission layer E2 may be described as having a ‘corresponding thickness’ to the blue resonance distance MB. Since the blue pixel PB may have only the second emission layer E2 for generating blue color light, only blue light may be emitted through the cathode electrode CAT. In particular, by maintaining the blue resonance distance MB, the luminous efficiency of blue light may be maximized.

Like the above description, the light emitting display device according to the first aspect may selectively provide light of the color assigned to each pixel, thus the color filter may be excluded from the display device. Therefore, there is no brightness loss of the light due to the color filter, higher luminance may be provided. It is not limited thereto, to increase the purity of the color light provided from each pixel, the color filter may be further disposed on top of the cathode electrode CAT.

In the first aspect, to adjust the resonance distance, the resonance layer CAL having transparency property is added on the transparent layer TRL. However, it is not limited thereto, by thickening the transparent layer TRL in the second pixel, the resonance distance needed for the second pixel may be adjusted or acquired.

Figure 6:
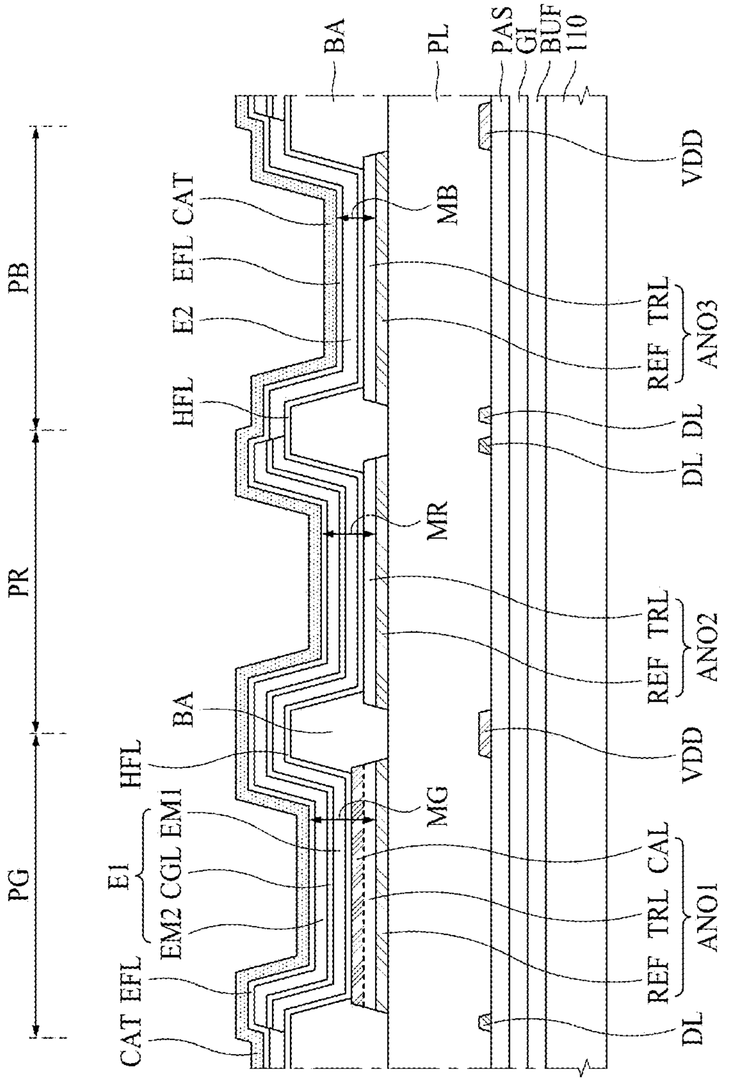
FIG. 6 is a cross-sectional view along to cutting line II-II' in FIG. 5, for illustrating a structure of successive pixels in a light emitting display device according to a second aspect of the present disclosure.

Hereinafter, referring to FIG. 6, a second aspect of the present disclosure will be described. FIG. 6 is a cross-sectional view along to cutting line II-II' in FIG. 5, for illustrating a structure of successive pixels in a light emitting display device according to a second aspect of the present disclosure.

The light emitting display device according to the second aspect may include a first pixel generating a first light, a second pixel generating a second light and a third pixel generating a third light, which are arrayed in succession. For example, the light emitting display device according to the second aspect may include a green pixel PG generating green light, a red pixel PR generating red light and a blue pixel PB generating blue light, which are arrayed in succession, without being limited thereto. The pixels of other colors are also possible, which are not shown in FIG. 6. Here, the green light may be referred to as a first light, the red light may be referred to as a second light, and the blue light may be referred to as a third light. Further, the green pixel PG may be referred to as a first pixel, the red pixel PR may be referred to as a second pixel, and the blue pixel PB may be referred to as a third pixel. The light emitting display device according to the second aspect may comprise a buffer layer BUF, a gate insulating layer GI, a passivation layer PAS and a planarization layer PL, which are sequentially deposited on a substrate 110. In FIG. 6, the elements of the thin film transistor disposed under the planarization layer PL may be not shown for convenience.

The structure of the light emitting display device according to the second aspect may be very similar to the light emitting display device according to the first aspect. The difference is mainly that: in the first aspect, the thickness of the first emission layer E1 may correspond to the green resonance distance MG, and a resonance layer CAL may be disposed in the red pixel PR. In the second aspect, the thickness of the first emission layer E1 may correspond to the red resonance distance MR, and a resonance layer CAL may be disposed in the green pixel PG.

A plurality of anode electrodes ANO1, ANO2 and ANO3 are formed on the planarization layer PL. The anode electrodes are assigned one by one to green pixel PG, red pixel PR and blue pixel PB arranged in succession. For example, a first anode electrode ANO1 may be disposed in the green pixel PG, a second anode electrode ANO2 may be disposed in the red pixel PR, and a third anode electrode ANO3 may be disposed in the blue pixel PB.

The first anode electrode ANO1 disposed in the green pixel PG may have a multi-layered structure in which a reflective layer REF, a transparent layer TRL and a resonance layer CAL may be sequentially deposited on the planarization layer PL. The first anode electrode ANO1 disposed in the green pixel PG may have a multi layered structure in which a reflective layer REF, a transparent layer TRL and a resonance layer CAL are sequentially stacked on the planarization layer PL. The second anode electrode ANO2 disposed in the red pixel PR may have a multi layered structure in which a reflective layer REF and a transparent layer TRL are sequentially stacked on the planarization layer PL The third anode electrode ANO3 disposed in the blue pixel PB may have a multi layered structure in which a reflective layer REF and a transparent layer TRL are sequentially stacked on the planarization layer PL. Here, the reflective layer REF and transparent layer TRL disposed in each pixel may have the same thickness, respectively.

An emission layer may be deposited on the anode electrodes ANO1, ANO2 and ANO3. In the second aspect, like the first aspect, a first emission layer E1 may be commonly disposed in the green pixel PG and the red pixel PR. In the blue pixel PB, a second emission layer E2 may be deposited as being separated from the first emission layer E1. Specifically, the first emission layer E1 may be commonly disposed on the anode electrodes ANO1, ANO2 in the green pixel PG and the red pixel PR, and the second emission layer E2 may be disposed on the anode electrode ANO3 in the blue pixel PB, without being limited thereto.

The first emission layer E1 may include a red light emitting layer, a charge generation layer and a green light emitting layer which are sequentially stacked on the first anode electrode ANO1 and the second anode electrode ANO2. For example, a red light emitting layer, a charge generation layer and a green light emitting layer are sequentially stacked on the first anode electrode ANO1 and the second anode electrode ANO2 . . . . For another example, the first emission layer E1 may include a green light emitting layer, a charge generation layer and a red light emitting layer which are sequentially stacked. Any one of the green light emitting layer and the red light emitting layer may be referred to as a first light emitting layer EM1 and the other may be referred to as a second light emitting layer EM2. For example, the first emission layer E1 may include a first light emitting layer EM1, a charge generation layer CGL and a second light emitting layer EM2 which are sequentially stacked on the first anode electrode ANO1 and the second anode electrode ANO2. The second emission layer E2 may include only a blue light emitting layer. For example, the second emission layer E2 may include only a third light emitting layer providing the blue light. For another example, the second emission layer E2 may include multiple layered third light emitting layer for providing blue light.

A cathode electrode CAT may be commonly deposited on the first emission layer E1 and the second emission layer E2 as being across the green pixel PG, the red pixel PR and the blue pixel PB. In the light emitting display device according to the second aspect, the cathode electrode CAT may include a semi-transparent conductive material. For example, the cathode electrode CA may be an ultra-thin metal layer which may be made of a metal material including aluminum (Al), silver (Ag), gold (Au) or magnesium (Mg) with a thickness in range of 10 nm to 30 nm, without being limited thereto.

In addition, a hole functional layer HFL may be disposed under the first emission layer E1 and the second emission layer E2. Further, an electron functional layer EFL may be disposed over the first emission layer E1 and the second emission layer E2. The hole functional layer HFL and the electron functional layer EFL may be commonly deposited as being across the green pixel PG, the red pixel PR and the blue pixel PB. In addition, the electron functional layer EFL may be deposited on the first emission layer E1 and the second emission layer E2 over the entire surface of the substrate 110. In addition, the hole functional layer HFL may be disposed under the first emission layer E1 and the second emission layer E2 over the entire surface of the substrate 110.

The light emitting display device according to the second aspect may have a micro-cavity structure in which the resonance phenomenon may occur between the reflective layer REF and the cathode electrode CAT. That is, the distance between the reflective layer REF and the cathode electrode CAT may be set to have an integer multiple of half wavelength of the color light provided at each pixel.

In the green pixel PG and the red pixel PR, the first emission layer E1 may be commonly deposited. Therefore, the thickness of the first emission layer E1 may be controlled to have a thickness corresponding to the red resonance distance MR of the red pixel PR. For example, the sum thickness of the transparent layer TRL, the hole functional layer HFL, the first emission layer E1 and the electron functional layer EFL sandwiched between the reflective layer REF and the cathode electrode CAT may be set to have a thickness of 630 nm, without being limited thereto. The first emission layer E1 include the green light emitting layer and the red light emitting layer, so green light and red light may be provided simultaneously. However, as the red pixel PR has the red resonance distance MR, only red light may be provided through the cathode electrode CAT.

The first emission layer E1 disposed in the red pixel PR may be extended to the green pixel PG. The first emission layer E1 may have the same structure from the red pixel PR to the green pixel PG. Therefore, the sum thickness of the transparent layer TRL, the hole functional layer HFL, the first emission layer E1 and the electron functional layer EFL may be 630 nm, in the green pixel PG. With this thickness, by the resonance effect of the micro-cavity, the red light may be emitted from the green pixel PG. However, a resonance layer CAL may be further disposed on the transparent layer TRL in the green pixel PG, without being limited thereto. By adjusting the resonance layer CAL, the distance between the reflective layer REF and the cathode electrode CAT may be set to the green resonance distance MG in the green pixel PG. For example, as the sum thickness of the transparent layer TRL, the hole functional layer HFL, the first emission layer E1 and the electron functional layer EFL, the distance between the reflective layer REF and the cathode electrode CAT may be set to have 825 nm, by depositing the resonance layer CAL with a thickness of 195 nm. Alternatively, by thickening the transparent layer TRL in the green pixel PG, the resonance distance needed for the green pixel PG may be adjusted or acquired. The first emission layer E1 may provide green light and the red light, because it has the green light emitting layer and the red light emitting layer stacked sequentially. However, as the green pixel PG has the green resonance distance MG, only green light may be provided through the cathode electrode CAT, at the green pixel PG.

In the blue pixel PB, the distance between the reflective layer REF and the cathode electrode may have a blue resonance distance MB. The blue resonance distance MB may have a thickness corresponding to an integer multiple of 230 nm, which is half of 460 nm, the representative wavelength of blue light. For example, the blue resonance distance MB may be any one of 230 nm, 460 nm, 690 nm, 920 nm and 1,150 nm. For example, the sum thickness of the transparent layer TRL, the hole functional layer HFL, the second emission layer E2 and the electron functional layer EFL which are disposed between the reflective layer REF and the cathode electrode CAT may be set to be 460 nm. As the second emission layer E2 disposed in the blue pixel PB may be separately deposited from the first emission layer E1 disposed in the green pixel PG and the red pixel PR, it may have different thickness from the first emission layer E1. The hole functional layer HFL and the electron functional layer EFL may be deposited as being extended from the green pixel PG to the red pixel PR, they may have uniform thickness across entire substrate 110. Therefore, the thickness of the second emission layer E2 may be adjusted for setting the blue resonance distance MB. As the blue pixel PB include only the second emission layer E2 providing the blue light, only blue light may be emitted through the cathode electrode CAT. In particular, by ensuring the blue resonance distance MB, the light efficiency of the blue light may be maximized.

The light emitting display device according to the second aspect may selectively provide light of the color assigned to each pixel, so the color filters may not be required. Therefore, there is no luminance decrease due to the color filters, so higher luminance may be acquired. However, it is not limited thereto, when increasing the purity of the color light provided from each pixel, additional color filters may be located on top of the cathode electrode CAT in each pixel.

In the first and second aspects, the resonance layer CAL is explained as one layer included in the anode electrode ANO. However, it is not limited thereto. When depositing the hole functional layer HFL, the first emission layer E1 and the electron functional layer EFL, the resonance layer CAL may be formed of an organic material. For example, an additional transparent organic material may be further deposited under the hole functional layer HFL or on the electron functional layer EFL to form the resonance layer CAL.

In the first aspect, in order to adjust the resonance distance, the resonance layer CAL having transparency property is added on the transparent layer TRL in the first pixel. However, it is not limited thereto, by thickening the transparent layer TRL in the first pixel, the resonance distance needed for the first pixel may be adjusted or acquired.

Figure 7:
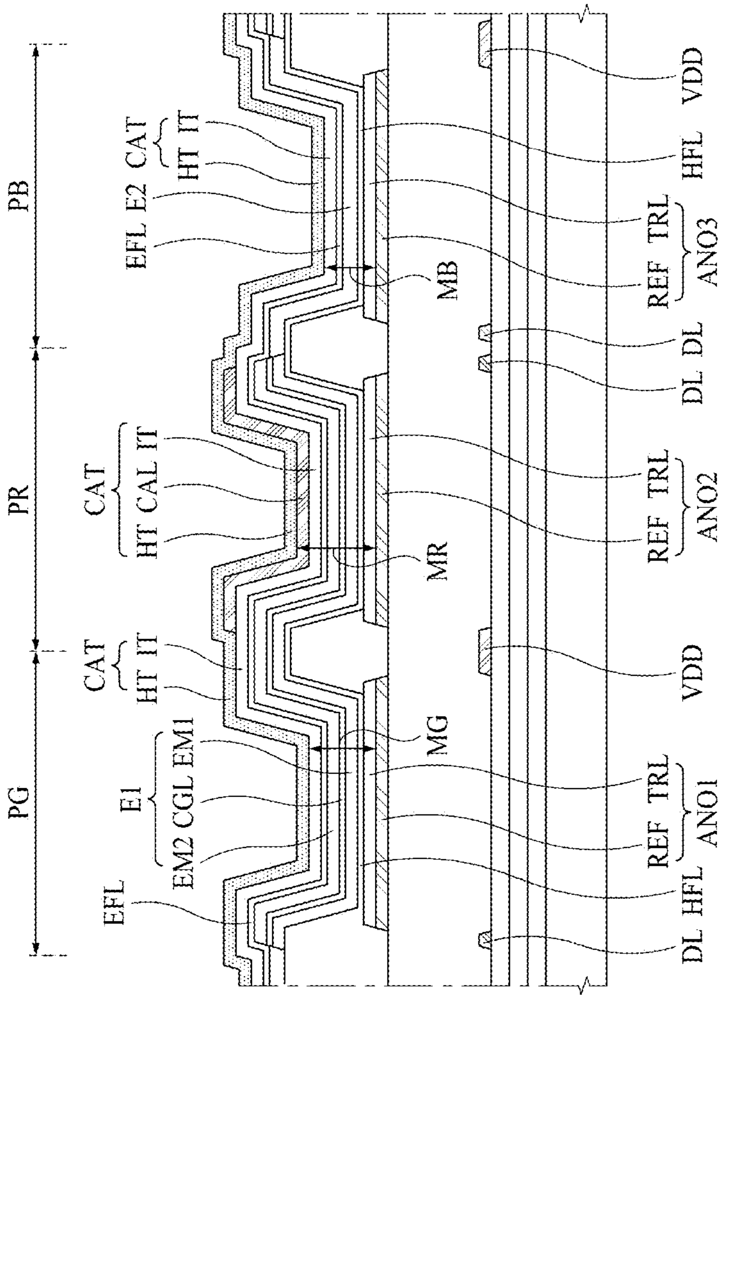
FIG. 7 is a cross-sectional view along to cutting line II-II' in FIG. 5, for illustrating a structure of successive pixels in a light emitting display device according to a third aspect of the present disclosure.

Hereinafter, referring to FIG. 7, a third aspect of the present disclosure will be described. FIG. 7 is a cross-sectional view along to cutting line II-II' in FIG. 3, for illustrating a structure of successive pixels in a light emitting display device according to a third aspect of the present disclosure.

In the first and second aspect, the structure in which the resonance layer CAL is added to the anode electrode ANO is explained. In the third aspect, a structure in which a resonance layer CAL is added to the cathode electrode CAT will be explained.

A light emitting display device according to the third aspect may include a first pixel generating a first light, a second pixel generating a second light and a third pixel generating a third light, which are arrayed in succession. For example, the light emitting display device according to a third aspect may comprise a green pixel PG providing green light, a red pixel PR providing red light and a blue pixel PB providing blue light, which are arrayed in succession, without being limited thereto. The pixels of other colors are also possible, which are not shown in FIG. 7. Here, the green light may be referred to as a first color light, the red light may be referred to a second color light and the blue light may be referred to as a third color light. Further, the green pixel PG may be referred to a first pixel, the red pixel PR may be referred to as a second pixel and the blue pixel PB may be referred to a third pixel. The light emitting display device according to third aspect may comprise a buffer layer BUF, a gate insulating layer GI, a passivation layer PAS and a planarization layer PL sequentially deposited on a substrate 110. FIG. 6 does not show the elements for thin film transistors disposed under the planarization layer PL.

A plurality of anode electrodes ANO1, ANO2 and ANO3 are formed on the planarization layer PL. A first anode electrode ANO1 disposed in the green pixel PG, a second anode electrode ANO2 disposed in the red pixel PR and a third anode electrode ANO3 disposed in the blue pixel PB may include a multi-layered structure in which a reflective layer REF and a transparent layer TRL are sequentially stacked on the planarization layer PL. Here, the reflective layer REF and transparent layer TRL disposed in each pixel may have the same thickness, respectively.

An emission layer may be deposited on the first anode electrode ANO1, the second anode electrode ANO2 and the third anode electrode ANO3. In the third aspect, a first emission layer E1 may be commonly deposited in the green pixel PG and the red pixel PR. In the blue pixel PB, a second emission layer E2 may be deposited separately from the first emission layer E1. Specifically, the first emission layer E1 may be commonly disposed on the anode electrodes ANO1, ANO2 in the green pixel PG and the red pixel PR, and the second emission layer E2 may be disposed on the anode electrode ANO3 in the blue pixel PB, without being limited thereto.

The first emission layer E1 may include a red light emitting layer, a charge generation layer and a green light emitting layer sequentially stacked. For example, a red light emitting layer, a charge generation layer and a green light emitting layer are sequentially stacked on the first anode electrode ANO1 and the second anode electrode ANO2. For another example, a green light emitting layer, a charge generation layer and a red light emitting layer may be sequentially stacked on the first anode electrode ANO1 and the second anode electrode ANO2 to form the first emission layer E1. Any one of the red light emitting layer and the green light emitting layer may be referred to as a first light emitting layer EM1, and the other may be referred to a second light emitting layer EM2. That is, the first emission layer E1 may have a structure in which a first light emitting layer EM1, a charge generation layer CGL and a second light emitting layer EM2 are sequentially stacked.

Meanwhile, the second emission layer E2 may include only a blue light emitting layer. For example, the second emission layer E2 may have a single layer of a third color light emitting layer providing blue light. For another example, the second emission layer E2 may include multiple layer of third color light emitting layers providing blue light. In the multiple layer structure, the second emission layer E2 may include a first blue light emitting layer including a light emitting material providing a blue light, a charge generation layer disposed on the first blue light emitting layer and a second blue light emitting layer disposed on the charge generation layer and including the light emitting material providing the blue light which are sequentially stacked on the third anode electrode ANO3.

A cathode electrode CAT may be deposited on the first emission layer E1 and the second emission layer E2. The cathode electrode CAT may have a structure in which a transparent cathode layer IT and a semi-transparent cathode layer HT are sequentially stacked. Further, to adjust a resonance distance for micro-cavity structure, the cathode electrode CAT may have a structure in which a transparent cathode layer IT, a resonance layer CAL and a semi-transparent cathode layer HT are sequentially stacked. Specifically, in the green pixel PG and blue pixel PB, the cathode electrode CAT may have a structure in which a transparent cathode layer IT and a semi-transparent cathode layer HT are sequentially stacked. Further, in the red pixel PR, the cathode electrode CAT may have a structure in which a transparent cathode layer IT, a resonance layer CAL and a semi-transparent cathode layer HT are sequentially stacked.

The transparent cathode layer IT may be made of a transparent conductive material such as indium-tin-oxide (ITO) or indium-zinc-oxide (IZO), without being limited thereto. The semi-transparent cathode layer HT, which is a layer for micro-cavity structure, may transmit part of the light incident from the emission layer and reflect the rest of the light. For example, the semi-transparent cathode layer HT may be an ultra-thin metal layer formed of a metal material such as aluminum (Al), silver (Ag), gold (Au) and magnesium (Mg) with a thickness of 10 nm to 30 nm. When the metal material is formed to a thickness of 10 nm to 30 nm, 70% to 30% of the incident light may be transmitted. To ensure the micro-cavity effect, in the light emitting display device according to the present disclosure, the semi-transparent cathode layer HT may have a thickness for transmitting 30% of light and reflecting 70% of light.

In detail, the transparent cathode layer IT may be deposited on the electron functional layer EFL with a single layer structure that commonly extends across the green pixel PG, the red pixel PR and the blue pixel PB on the entire substrate 110. A resonance layer CAL may be further formed on the transparent cathode layer IT as being corresponding to the red pixel PR. In this case, the resonance layer CAL is not formed on the green pixel PG and the blue pixel PB. In the green pixel PG and the blue pixel PB, the semi-transparent cathode layer HT may be disposed on the transparent cathode layer IT, and in the red pixel PR, the semi-transparent cathode layer HT may be disposed on the resonance layer CAL, and the resonance layer CAL may be disposed on the transparent cathode layer IT.

In addition, a hole functional layer HFL may be disposed under the first emission layer E1 and the second emission layer E2 and over the anode electrodes ANO1, ANO2 and ANO3. Further, an electron functional layer EFL may be disposed over the first emission layer E1 and the second emission layer E2 and under the transparent cathode layer IT. The hole functional layer HFL and the electron functional layer EFL may be commonly deposited across the green pixel PG, the red pixel PR and the blue pixel PB.

The light emitting display device according to the third aspect may have a micro-cavity structure in which a resonance phenomenon occurs between the reflective layer REF and the semi-transparent cathode layer HT. That is, the distance between the reflective layer REF and the semi-transparent cathode layer HT may be set to be one of the integer multiples of the half-wavelength of the color light provided from each pixel.

Between the reflective layer REF and the semi-transparent cathode layer HT in the green pixel PG may be the green resonance distance MG. For example, the green resonance distance MG may have a thickness corresponding to an integer multiple of 275 nm, which is ½ of 550 nm, the representative wavelength of green light. For example, the green resonance distance MG may be any one of 275 nm, 550 nm, 825 nm, 1,100 nm and 1,375 nm.

Between the reflective layer REF and the semi-transparent cathode layer HT in the red pixel PR may be the red resonance distance MR. For example, the red resonance distance MR may have a thickness corresponding to an integer multiple of 315 nm, which is ½ of 630 nm, the representative wavelength of red light. For example, the red resonance distance MR may be any one of 315 nm, 630 nm, 945 nm, 1,260 nm and 1,575 nm.

The first emission layer E1 may be commonly deposited in the green pixel PG and the red pixel PR. Therefore, the thickness of the first emission layer E1 may be adjusted to be corresponding to the green resonance distance MG of the green pixel PG. For example, the sum thickness of the transparent layer TRL, the hole functional layer HFL, the first emission layer E1 and the electron function layer which are disposed between the reflective layer REF and the cathode electrode CAT may be set to have a thickness of 550 nm, without being limited thereto. Here, the hole functional layer HFL and the electron functional layer EFL may be deposited as extending over the green pixel PG, the red pixel PR and the blue pixel PB, so they may have a uniform thickness over entire substrate 110. Therefore, the thickness of the first emission layer E1 may be adjusted to set the resonance distance. Here, the first emission layer E1 is not the layer having the green resonance distance MG, but the layer for adjusting the green resonance distance MG. Therefore, the first emission layer E1 may have a 'corresponding thickness' to the green resonance distance MG. The first emission layer E1 may provide green light and red light simultaneously, because the first emission layer E1 have the green light emitting layer and the red light emitting layer. However, as the green pixel PG have the green resonance distance MG, the green pixel PG may provide only the green light through the cathode electrode CAT.

The first emission layer E1 disposed in the red pixel PR may be extended to the green pixel PG. The first emission layer E1 may be disposed in the red pixel PR having the same structure of first emission layer E1 disposed in the green pixel PG. Therefore, the sum thickness of the transparent layer TRL, the hole functional layer HFL, the first emission layer E1 and the electron function layer EFL which are disposed between the reflective layer REF and the cathode electrode CAT may have a thickness of 550 nm, in the red pixel PR. Under this condition, the red pixel PR may provide green light due to the resonance effect of the micro-cavity. However, in the red pixel PR, a resonance layer CAL may be further disposed between the transparent cathode layer IT and the semi-transparent cathode layer HT, without being limited thereto. By adjusting the thickness of the resonance layer CAL, the distance between the reflective layer REF and the semi-transparent cathode layer HT in the red pixel PR may be set to correspond to the red resonance distance MR. For example, as the sum thickness of the transparent layer TRL, the hole functional layer HFL, the first emission layer E1 and the electron function layer EFL is 550 nm, by setting the resonance layer CAL to a thickness of 80 nm, the distance between the reflective layer REF and the semi-transparent cathode layer HT may be set to 630 nm. The first emission layer E1 may provide green light and red light simultaneously, because the first emission layer E1 have the green light emitting layer and the red light emitting layer. However, as the red pixel PR have the red resonance distance MR, the red pixel PR may provide only the red light through the cathode electrode CAT, at the red pixel PR.

The distance between the reflective layer REF and the semi-transparent cathode layer HT in the blue pixel PB may be the blue resonance distance MB. For example, the blue resonance distance MB may have a thickness corresponding to an integer multiple of 230 nm, which is ½ of 460 nm, the representative wavelength of blue light. For example, the blue resonance distance MB may be any one of 230 nm, 460 nm, 690 nm, 920 nm and 1,150 nm. For example, the sum thickness of the transparent layer TRL, the hole functional layer HFL, the second emission layer E2 and the electron functional layer EFL between the reflective layer REF and the semi-transparent cathode layer HT may be set to 460 nm. As the second emission layer E2 disposed in the blue pixel PB may be deposited separately from the first emission layer E1 disposed in the green pixel PG and the red pixel PR, the second emission layer E2 may be deposited as having different thickness from the first emission layer E1. As the hole functional layer HFL and the electron functional layer EFL may be deposited as extending from the green pixel PG and the red pixel PR, they may have a uniform thickness over entire substrate 110. Therefore, the thickness of the second emission layer E2 may be adjusted for setting the blue resonance distance MB. Here, the second emission layer E2 is not the layer having the blue resonance distance MB, but the layer for adjusting the blue resonance distance MB. Therefore, the second emission layer E2 may be referred to as having a 'corresponding thickness' to the blue resonance distance MB. As the blue pixel PB may have only the second emission layer E2 providing the blue light, only blue light may be emitted through the cathode electrode CAT. In particular, by ensuring the blue resonance distance MB, the luminance efficiency of the blue light may be maximized.

In the description for the third aspect, in the second dpixel, the resonance layer CAL may be disposed between the transparent cathode layer IT and the semi-transparent cathode layer HT. That is, the cathode electrode CAT may have a structure in which a transparent cathode layer IT, a resonance layer CAL and a semi-transparent cathode layer HT are sequentially stacked. However, it is not limited thereto, in the second pixel, the resonance layer CAL may be disposed under the transparent cathode layer IT. That is, the cathode electrode CAT may have a structure in which a resonance layer CAL, a transparent cathode layer IT and a semi-transparent cathode layer HT are sequentially stacked.

For the third aspect, the cathode electrode CAT may include the transparent cathode layer IT and the semi-transparent cathode layer HT, or the transparent cathode layer IT, the resonance layer CAL and the semi-transparent cathode layer HT. Therefore, the cathode electrode CAT may have thick thickness, so it may be easily acquire for the cathode electrode CAT to have lower sheet resistance. By applying the third aspect to large area light emitting display device, the sheet resistance of the cathode may be maintained uniformly low value across entire substrate. However, it is not limited thereto, the semi-transparent cathode layer HT and/or the resonance layer CAL deposited on the transparent cathode layer IT may be made of non-conductive material not to have electrical conductivity.

The light emitting display device according to the third aspect may selectively provide light of the color assigned to each pixel, so the color filters may not be required. Therefore, there is no luminance decrease due to the color filters, so higher luminance may be acquired. However, it is not limited thereto, when increasing the purity of the color light provided from each pixel, additional color filters may be located on top of the cathode electrode CAT in each pixel.

From the first aspect to the third aspect, the resonance layer CAL may be one element included in the anode electrode ANO or the cathode electrode CAT. However, it is not limited thereto, the resonance layer may be formed by depositing an additional layer on the electron functional layer EFL or under the hole functional layer HFL. For another example, the anode electrode is made of a transparent layer, an insulating layer having a certain thickness under the transparent layer, and then a resonance layer may be further deposited between the insulating layer and the transparent layer only in the pixel that require to adjust the resonance distance, or the thickness of the insulating layer is formed differently only in the pixel that require to adjust the resonance distance.

According to the first to third aspects above explained, the light emitting display device according to the present disclosure may have three pixels providing three color lights, with a first emission layer disposed in the first pixel and the second pixel, and a second emission layer disposed in the third pixel, for ensuring the micro-cavity structure. The first emission layer and the second emission layer may be formed with different thicknesses. As the result, by adjusting the thickness of the second emission layer, a micro-cavity structure may be implemented at the third pixel. That is, the micro-cavity for the third pixel may be implemented without forming any resonance layer.

Further, the first emission layer may be set to have a thickness for implementing the micro-cavity effect in the first pixel, and a resonance layer may be added to the second pixel to implement the micro-cavity effect for the second pixel. Therefore, the number of the resonance layer or manufacturing steps for forming the resonance layers having different thicknesses from each other may be minimized. Further, the micro-cavity effect and structure may be exactly and precisely implemented in each of the three pixels.

With the above-mentioned aspects, the first pixel is the green pixel, the second pixel is the red pixel and the third pixel is the blue pixel. This configuration is to facilitate brightness control by using the blue pixel independently, because higher luminance is required from the blue pixel due to the device characteristics currently used for the emission layer. Therefore, depending on the characteristics of the material used in the emission layer or the conditions of color combination for generating white light, the first pixel, the second pixel and the third pixel may have a combination of colors different from the combination of green, red and blue.

Like this, since a micro-cavity structure may be accurately established for each color pixel, a more strengthened micro-cavity structure than the existing ones may be implemented. Therefore, without color filter over the cathode electrode CAT, each pixel may provide clear and vivid color light. Without color filter, there is no reduction of the light luminance that may occur as the light passes through the color filters. As the result, the present disclosure may provide a light emitting display in which higher luminance may be provided with the same power consumption, or power consumption to acquire the same luminance may be lowered.

Consequently, the present disclosure may provide a light emitting display device with a simple structure and manufacturing process, and low cost for manufacturing the display device. The light emitting efficiency of color light allocated to each pixel may be maximized. As an enhanced micro-cavity structure may be implemented, each pixel may provide clear color light without applying color filter. Accordingly, the present disclosure may provide a light emitting display device with high brightness with low power consumption.

The features, structures, effects and so on described in the above examples of the present disclosure are included in at least one example of the present disclosure, and are not limited to only one example. Furthermore, the features, structures, effects and the likes explained in at least one example may be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents. These and other changes may be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Thus, it is intended that the present disclosure covers the modifications and variations of the aspects provided they come within the scope of the appended claims and their equivalents.

What is claimed is:

1. A light emitting display device comprising:

a first pixel emitting a first light, a second pixel emitting a second light and a third pixel emitting a third light, the first pixel, the second pixel and the third pixel arrayed on a substrate;

anode electrodes disposed at each of the first pixel, the second pixel and the third pixel, the anode electrode including a transparent layer;

a reflective layer disposed under the anode electrode;

a first emission layer disposed on the anode electrodes over the first pixel and the second pixel;

a second emission layer disposed on the anode electrode at the third pixel;

a cathode electrode disposed on the first emission layer and the second emission layer; and a resonance layer disposed at one of an upper side and a lower side of the first emission layer.

2. The light emitting display device according to claim 1, wherein a first distance between the reflective layer and the cathode electrode in the first pixel is set to a first resonance distance corresponding to one of integer multiples of half-wavelength of the first light, wherein a second distance between the reflective layer and the cathode electrode in the second pixel is set to a second resonance distance corresponding to one of integer multiples of half-wavelength of the second light, and wherein a third distance between the reflective layer and the cathode electrode in the third pixel is set to a third resonance distance corresponding to one of integer multiples of half-wavelength of the third light.

3. The light emitting display device according to claim 2, wherein a thickness of the first emission layer corresponds to the first resonance distance, a sum thickness of the first emission layer and the resonance layer corresponds to the second resonance distance, and a thickness of the second emission layer corresponds to the third resonance distance.

4. The light emitting display device according to claim 3, wherein the first light is a green light, wherein the second light is a red light, and wherein the third light is a blue light.

5. The light emitting display device according to claim 3, wherein the first light is a red light, wherein the second light is a green light, and wherein the third light is a blue light.

6. The light emitting display device according to claim 3, wherein the anode electrodes include:

a first anode electrode disposed at the first pixel;

a second anode electrode disposed at the second pixel; and a third anode electrode disposed at the third pixel, wherein the second anode electrode includes the transparent layer and the resonance layer.

7. The light emitting display device according to claim 6, wherein the cathode electrode includes a semi-transparent layer transmitting some parts of a light provided from the first emission layer and the second emission layer, and reflecting remaining parts of the light.

8. The light emitting display device according to claim 6, wherein the first anode electrode and the third anode electrode include the reflective layer and the transparent layer, and wherein the second anode electrode includes the reflective layer, the transparent layer and the resonance layer.

9. The light emitting display device according to claim 6, wherein the second anode electrode and the third anode electrode include the reflective layer and the transparent layer, and wherein the first anode electrode includes the reflective layer, the transparent layer and the resonance layer.

10. The light emitting display device according to claim 1, wherein the cathode electrode includes:

a transparent cathode layer; and a semi-transparent cathode layer on the transparent layer, and wherein the resonance layer is disposed at any one of between the transparent cathode layer and the semi-transparent cathode layer and under the transparent cathode layer, in the second pixel.

11. The light emitting display device according to claim 10, wherein a first distance between the reflective layer and the semi-transparent cathode layer in the first pixel is set to a first resonance distance corresponding to one of integer multiples of half-wavelength of the first light, wherein a second distance between the reflective layer and the semi-transparent cathode layer in the second pixel is set to a second resonance distance corresponding to one of integer multiples of half-wavelength of the second light, and wherein a third distance between the reflective layer and the semi-transparent cathode layer in the third pixel is set to a third resonance distance corresponding to one of integer multiples of half-wavelength of the third light.

12. The light emitting display device according to claim 1, wherein the first emission layer includes:

a first light emitting layer configured to provide the first light;

a charge generation layer disposed on the first light emitting layer; and a second light emitting layer disposed on the charge generation layer and configured to provide the second light.

13. The light emitting display device according to claim 12, wherein the first light emitting layer includes a first light emitting material configured to provide a green light, and wherein the second light emitting layer includes a second light emitting material configured to provide a red light.

14. The light emitting display device according to claim 12, wherein the first light emitting layer includes a first light emitting material configured to provide a red light, and wherein the second light emitting layer includes a second light emitting material configured to provide a green light.

15. The light emitting display device according to claim 1, wherein the second emission layer includes only a third light emitting material configured to provide a blue light.

16. The light emitting display device according to claim 1, wherein the second emission layer includes:

a third light emitting layer including a third light emitting material configured to provide a blue light;

a charge generation layer disposed on the third light emitting layer; and a fourth light emitting layer disposed on the charge generation layer and including the third light emitting material configured to provide the blue light.

17. The light emitting display device according to claim 1, further comprising:

a hole functional layer disposed between the anode electrode and the first emission layer and the second emission layer; and an electron functional layer disposed between the cathode electrode and the first emission layer and the second emission layer.

18. The light emitting display device according to claim 17, wherein the resonance layer is disposed at any one of between the hole functional layer and the first emission layer and between the first emission layer and the electron functional layer.

19. The light emitting display device according to claim 1, wherein the transparent layer is disposed between the resonance layer and the reflective layer.

20. A light emitting display device comprising:

a first pixel providing a first light, a second pixel providing a second light and a third pixel providing a third light, the first pixel, the second pixel and the third pixel arrayed on a substrate;

anode electrodes disposed at each of the first pixel, the second pixel and the third pixel, the anode electrode including a transparent layer;

a reflective layer disposed under the anode electrode;

a first emission layer disposed over the first pixel and the second pixel, on the anode electrodes;

a second emission layer disposed at the third pixel, on the anode electrode;

a cathode electrode on the first emission layer and the second emission layer; and a resonance layer disposed on the transparent layer in the first pixel or the second pixel.

* * * * *